United States Patent
Liu et al.

(10) Patent No.: US 11,348,831 B2
(45) Date of Patent: May 31, 2022

(54) METHOD OF MANUFACTURING A SEMICONDUCTOR UNIT

(71) Applicant: Universal Global Technology (Shanghai) Co., Ltd, Shanghai (CN)

(72) Inventors: Chia-Cheng Liu, Shanghai (CN); Xiao-Lei Zhou, Shanghai (CN)

(73) Assignee: UNIVERSAL GLOBAL TECHNOLOGY (SHANGHAI) CO., LTD, Shanghai (CN)

( * ) Notice: Subject to any disclaimer, the term of this patent is extended or adjusted under 35 U.S.C. 154(b) by 133 days.

(21) Appl. No.: 16/571,359

(22) Filed: Sep. 16, 2019

(65) Prior Publication Data

US 2021/0005512 A1    Jan. 7, 2021

(30) Foreign Application Priority Data

Jul. 4, 2019   (CN) .......................... 201910598401.4

(51) Int. Cl.
*H01L 25/065*   (2006.01)
*H01L 23/31*    (2006.01)
(Continued)

(52) U.S. Cl.
CPC .... *H01L 21/76877* (2013.01); *H01L 21/3043* (2013.01); *H01L 21/4853* (2013.01);
(Continued)

(58) Field of Classification Search
CPC ............... H01L 23/3121; H01L 23/552; H01L 23/49833; H01L 23/5389; H01L 25/0657; H01L 2225/06524; H01L 2225/06527; H01L 2225/06548; H01L 2224/73204; H01L 2224/32225; H01L 2224/16225; H01L 21/56; H01L 2924/181; H01L 21/76877–78883
See application file for complete search history.

(56) References Cited

U.S. PATENT DOCUMENTS 7,633,765 B1   12/2009   Scanlan et al.
8,004,074 B2 *   8/2011   Mori .................. H01L 21/6835
                                                                      257/686
(Continued)

FOREIGN PATENT DOCUMENTS

CN   101911847 A   12/2010
CN   103813640 A    5/2014
(Continued)

*Primary Examiner* — Michael M Trinh
(74) *Attorney, Agent, or Firm* — Li & Cai Intellectual Property (USA) Office

(57) ABSTRACT

A semiconductor assembly manufacturing method includes: providing a substrate including a first conductive circuit; disposing a first electronic component on a side of the substrate; forming a first plastic seal layer covering the substrate and the first electronic component; setting up a plurality of grooves in the first plastic seal layer, the groove exposes at least a portion of the first conductive circuit of the substrate; and filling a conductive material in each of the grooves by vacuum printing so as to form a second conductive circuit electrically connected to the first conductive circuit of the substrate, and a second electronic component pad position thereof in the first plastic seal layer.

3 Claims, 12 Drawing Sheets

(51) Int. Cl.
*H01L 23/498* (2006.01)
*H01L 23/538* (2006.01)
*H01L 23/552* (2006.01)
*H01L 21/768* (2006.01)
*H01L 21/304* (2006.01)
*H01L 21/48* (2006.01)
*H01L 21/56* (2006.01)

(52) U.S. Cl.
CPC .......... *H01L 21/56* (2013.01); *H01L 23/3121* (2013.01); *H01L 23/49833* (2013.01); *H01L 23/5389* (2013.01); *H01L 23/552* (2013.01); *H01L 25/0657* (2013.01); *H01L 2224/16225* (2013.01); *H01L 2224/32225* (2013.01); *H01L 2224/73204* (2013.01); *H01L 2225/06524* (2013.01); *H01L 2225/06527* (2013.01); *H01L 2225/06548* (2013.01)

(56) References Cited

U.S. PATENT DOCUMENTS

| | | | | |
|---|---|---|---|---|
| 8,435,424 | B2 * | 5/2013 | Hsu | H01B 1/22 252/500 |
| 8,975,732 | B2 * | 3/2015 | Tojo | H01L 24/19 257/666 |
| 9,368,475 | B2 * | 6/2016 | Chen | H01L 21/561 |
| 9,508,689 | B2 * | 11/2016 | Co | H01L 24/05 |
| 2004/0212086 | A1 * | 10/2004 | Dotta | H01L 23/3114 257/737 |
| 2008/0070011 | A1 | 3/2008 | Oh et al. | |
| 2010/0236698 | A1 * | 9/2010 | Sekimoto | H05K 3/4069 156/221 |
| 2011/0210452 | A1 * | 9/2011 | Roozeboom | H01L 21/4846 257/774 |
| 2011/0248184 | A1 * | 10/2011 | Shah | A61B 5/1459 250/458.1 |
| 2013/0200528 | A1 * | 8/2013 | Lin | H01L 23/3157 257/774 |
| 2018/0068977 | A1 * | 3/2018 | Wang | H01L 24/24 |
| 2018/0068989 | A1 * | 3/2018 | Chew | H01L 25/50 |
| 2018/0190604 | A1 | 7/2018 | Oka et al. | |
| 2018/0240760 | A1 * | 8/2018 | Kasai | H01L 21/4857 |
| 2019/0378817 | A1 * | 12/2019 | Lin, Jr. | H01L 23/3121 |

FOREIGN PATENT DOCUMENTS

| | | |
|---|---|---|
| CN | 204011396 U | 12/2014 |
| CN | 104347624 A | 2/2015 |
| CN | 104505351 A | 4/2015 |
| CN | 107154385 A | 9/2017 |
| JP | 200539227 A | 2/2005 |
| TW | 511265 B | 11/2002 |
| TW | 201601262 A | 1/2016 |

* cited by examiner

METHOD OF MANUFACTURING A SEMICONDUCTOR UNIT

CROSS-REFERENCE TO RELATED PATENT APPLICATION

This application claims the benefit of priority to China Patent Application No. 201910598401.4 filed on Jul. 4, 2019 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a field of electronic devices, and more particularly to a semiconductor assembly manufacturing method.

BACKGROUND OF THE DISCLOSURE

Package on package (POP) is a packaging technology and process commonly used in semiconductor unit. Specifically, the structure of the package on package is shown in FIG. 1. An electronic component 113 is assembled by reflow soldering on a lower substrate 112, a compression molding layer is formed on the electronic component 113, and a through hole is formed on the compression molding layer. Another electronic component 114 is assembled by reflow soldering on an upper substrate 111, and a compression molding layer is formed on the other electronic component 114; the upper substrate 111 and the lower substrate 112 are assembled again by reflow soldering. However, such technique has the following drawbacks: the overall thickness of the semiconductor assembly is increased by stacking a plurality of substrates is increased; a wiring in the upper and lower substrates will be performed in a wet process, but the wet process has a problem of high contamination; and multiple times of reflow soldering is required for assembly, with each reflow soldering process having an impact on the components, causing warpage when upper and lower joints are combined, and making it difficult to align the connection.

A redistribution layer (RDL) process is another commonly used packaging technology and process in semiconductor unit. The redistribution layer typically uses a wet process to complete the wiring on a fan-out molding. The structure of the semi-conductor unit of the redistribution layer is shown in FIG. 2. However, such technique has the following drawbacks: high contamination problem in the wet process; increased package area of the semiconductor assembly, since each electronic component 122 undergoes redistribution on the same substrate 121; and the redistribution layer technology can only be used for simple chip assembly due to the planarized circuit design, which does not have complex system integration capabilities.

In the existing manufacturing process of an adapter plate (as shown in FIG. 3A to FIG. 3C), a plurality of solder balls 132 are formed by reflow soldering on the substrate 131, and the substrate 131 are cut, stacked, and then cut again to obtain the adapter plate. The adapter plate is attached to a mother board to complete the assembly by solder balls 134 formed by solder printing. However, such a technique has the following drawbacks: the overall thickness of the semiconductor assembly is increased by stacking the plurality of substrates; the cost of manufacturing is high due to lengthy process; and multiple times of reflow soldering is required for assembly, with each reflow soldering process has an impact on components, causing warpage when upper and lower joints are combined, and making it difficult to align the connection.

However, at present, since electronic products are gradually being miniaturized and thinned, thereby greatly increasing the distribution density of electronic components and circuits, the above existing technical solutions are difficult to meet the needs of current electronic products.

SUMMARY OF THE DISCLOSURE

In response to the above-referenced technical inadequacies, the present disclosure provides a method of manufacturing a semiconductor unit that miniaturizes a semiconductor unit, increases reliability of a semiconductor unit, and reduces manufacturing costs.

In one aspect, the present disclosure provides a method of manufacturing a semiconductor unit, including: providing a substrate including a first conductive circuit; disposing a first electronic component on a side of the substrate; forming a first plastic seal layer covering the substrate and the first electronic component; setting up a plurality of grooves in the first plastic seal layer, the groove exposing at least a portion of the first conductive circuit of the substrate; and filling a conductive material in each of the grooves by vacuum printing so as to form a second conductive circuit electrically connected to the first conductive circuit of the substrate in the first plastic seal layer.

In certain embodiments, after the conductive material is filled in each of the grooves by vacuum printing to form the second conductive circuit electrically connected to the first conductive circuit of the substrate in the first plastic seal layer, the method further includes: forming a non-conductive circuit by vacuum printing on a side of the second conductive circuit facing away from the substrate, the non-conductive circuit being electrically connected to the second conductive circuit.

In certain embodiments, after the conductive material is filled in each of the grooves by vacuum printing to form the second conductive circuit electrically connected to the first conductive circuit of the substrate in the first plastic seal layer, the method further includes: grinding the first plastic seal layer and the second conductive circuit away from the side of the substrate to a set position; and disposing at least one second electronic component on the side of the first plastic seal layer and the second conductive circuit facing away from the substrate, the second electronic component being electrically connected to the at least second conductive circuit which is partly grinded.

In certain embodiments, after the first electronic component is disposed on the side of the substrate and before the first plastic seal layer is formed, the method further includes: disposing at least one third electronic component on the same side of the first electronic component on the substrate; and the first plastic seal layer covers the third electronic component, and the distance between the set position and the first electronic component and/or the third electronic component is greater than a predetermined distance.

In certain embodiments, at least a portion of the groove includes a first groove between the first electronic component and the third electronic component, and a second groove in communication with the first groove on a side of the first electronic component, the third electronic component facing away from the substrate, and the first groove and the second groove are filled with the conductive material by vacuum printing.

In certain embodiments, the first groove and the second groove are connected at a rounded structure.

In certain embodiments, the vacuum printing includes filling the conductive material in each of the grooves, vacuuming, and vacuum breaking process.

In certain embodiments, the conductive material filled in each of the grooves by vacuum printing has a thixotropic index greater than 4.5; and the conductive material has a viscosity greater than 105000 cpa·s.

Therefore, the circuit connection and packaging of the semiconductor unit are implemented by vacuum printing, so that the layout of electronic components does not require stacking the plurality of substrates and that the semiconductor assembly is miniaturized; the second conductive circuit formed by filling the conductive material by vacuum printing technology has high density, which makes wiring stable and maintains better electrical performance; the number of the stacked substrates is reduced to prevent warpage caused by heat treatment and affect the alignment of components; the steps of the process are reduced compared to the process of the related art, thereby saving processing time and cost; and vacuum printing technology can be used instead of a wet process to reduce pollution and wastewater.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
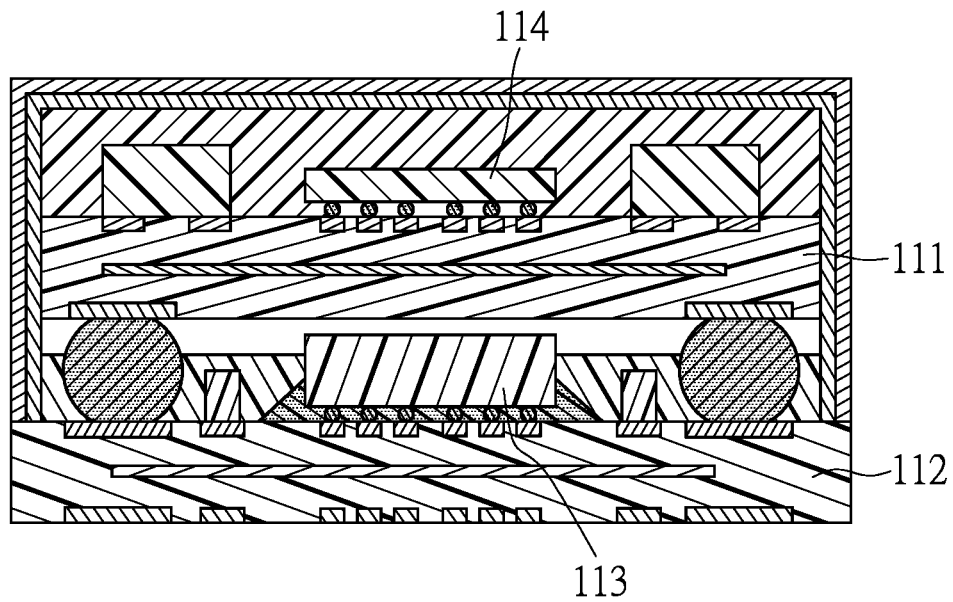
FIG. 1 is a cross-sectional view of a conventional semiconductor assembly using a package on package.
Figure 2:
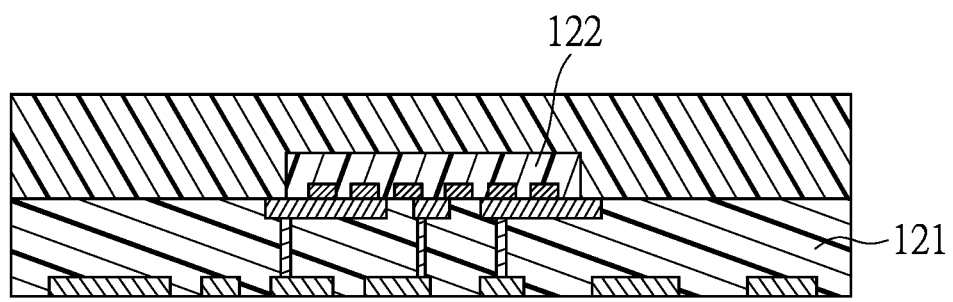
FIG. 2 is a cross-sectional view of a conventional semiconductor assembly using a redistribution layer.
Figure 3A:
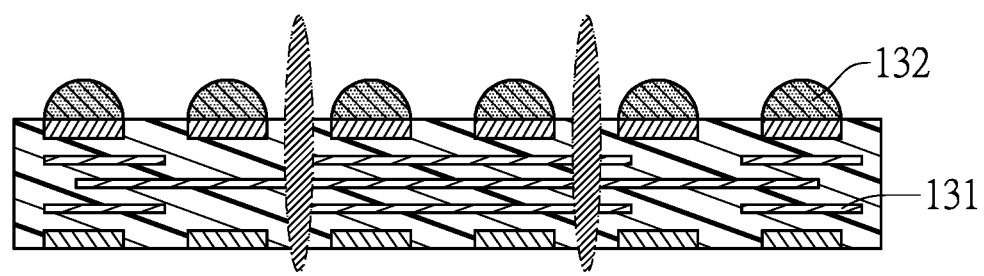
FIGS. 3A to 3C are schematic views of a process of a conventional adapter plate.
Figure 3B:
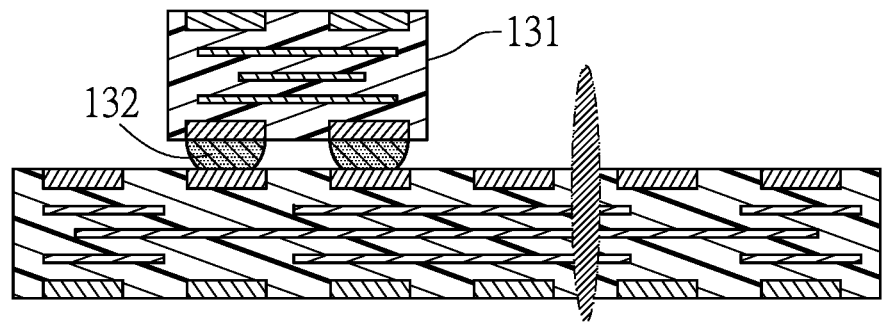
Figure 3C:
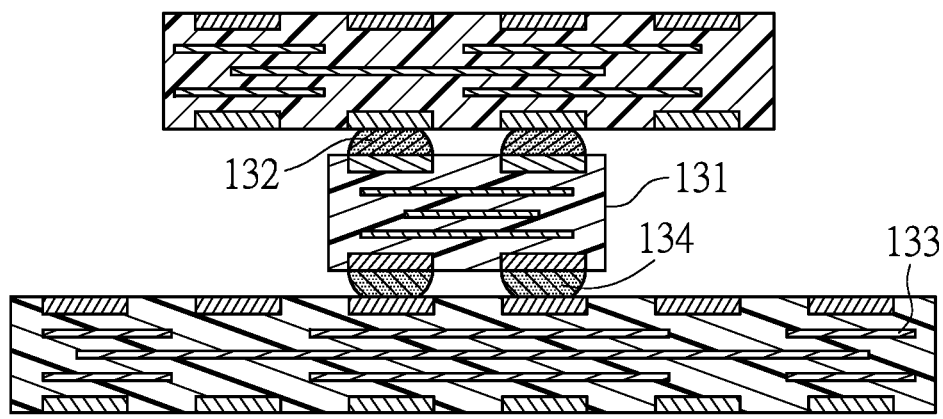

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

In a first embodiment of the present disclosure, a method of manufacturing a semiconductor unit is provided, and will be described below with reference to the flowchart of FIG. 4 and the manufacturing process of FIGS. 5A to 5E. The method of manufacturing semiconductor unit includes the following steps:

Step S210: providing a substrate 310 including a first conductive circuit 311.

Figure 5A:
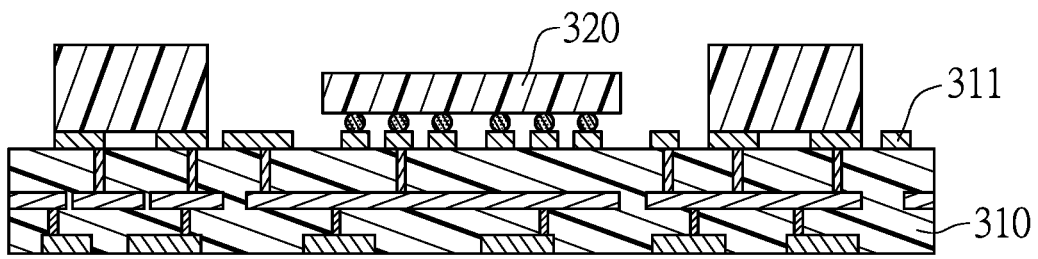
FIGS. 5A to 5E are schematic views of a manufacturing process of the semiconductor assembly according to the first embodiment of the present disclosure.
Figure 5B:
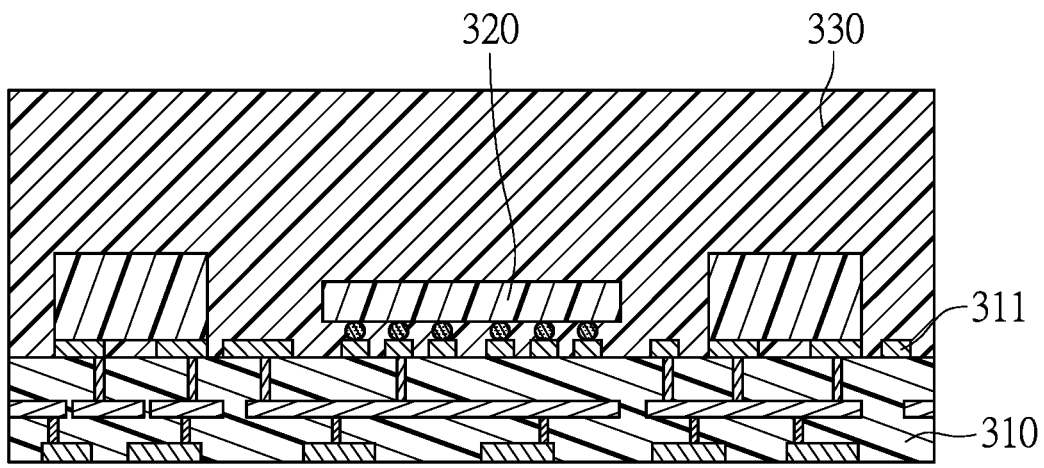

As shown in FIG. 5A, the first conductive circuit 311 may be formed on a side surface of the substrate 310. In other embodiments, the first conductive circuit 311 may be formed in the substrate 310 and may form a conductive pattern on a side of the substrate 310.

Step S220: disposing a first electronic component 320 on the side of the substrate 310.

Specifically, the first electronic component 320 may be disposed on the side of the substrate 310 by reflow soldering, and the first electronic component 320 may be electrically connected to the first conductive circuit 311 of the substrate 310 through a solder ball. The assembly of the first electronic component 320 and the substrate 310 is not limited thereto, and those skilled in the art can implement more variations.

Step S230: forming a first plastic seal layer 330 covering the substrate 310 and the first electronic component 320.

Specifically, the first plastic seal layer may be, for example, a thermosetting plastic. The coverage of the substrate 310 and the first electronic component 320 to the first plastic seal layer 330 can be seen in FIG. 5B.

Step S240: a plurality of grooves 340 are set up in the first plastic seal layer 330, and the grooves 340 expose at least a portion of the first conductive circuit 311 of the substrate 310.

Figure 5C:
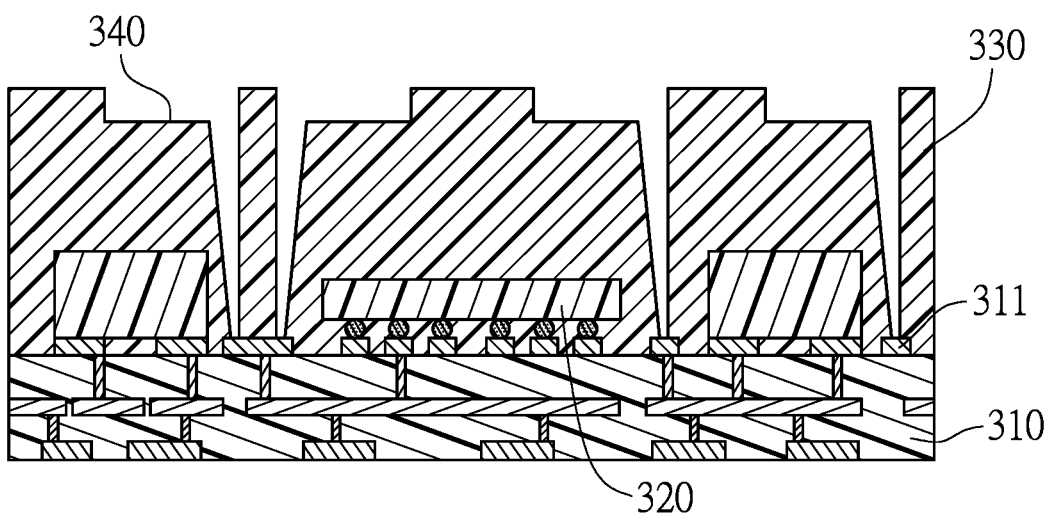

Specifically, a laser drill process or a trench process may be adopted to form groove 340 in the first plastic seal layer 330, as shown in FIG. 5C.

Step S250: filling a conductive material 351 in each of the grooves 340 by vacuum printing to form a second conductive circuit 350 electrically connected to the first conductive circuit 311 of the substrate 310 in the first plastic seal layer 330.

Specifically, vacuum printing technology refers to a technique of reducing the degree of vacuum after vacuum printing, and filling a desired material deep into the groove by a pressure difference generated thereby.

Figure 5D:
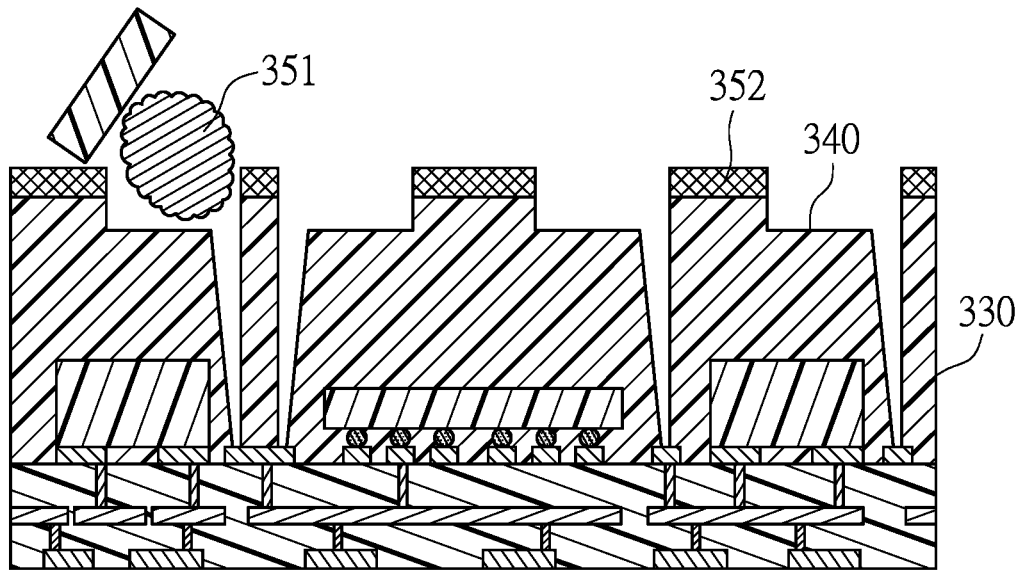
Figure 5E:
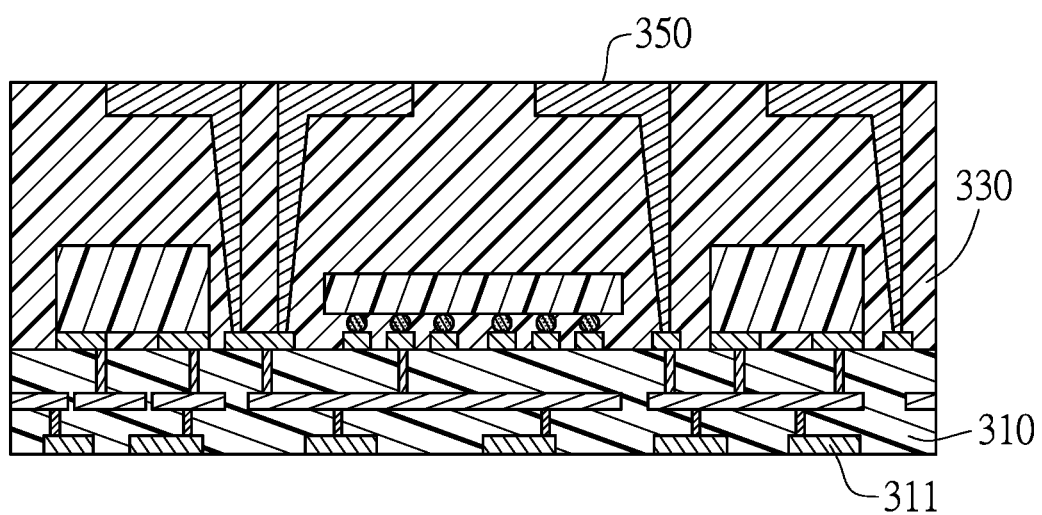

In the present embodiment, as shown in FIGS. 5D to 5E, a pattern defining layer 352 is formed/disposed on the side of the first plastic seal layer 330 facing away from the substrate 310 to define a circuit pattern of the first plastic seal layer 330 facing away from the surface of the substrate 310. At the same time, the conductive material 351 is prevented from remaining on the surface of the first plastic seal layer 330 facing away from the substrate 310 without disposing a circuit pattern. The conductive material 351 is filled into each of the grooves 340 by vacuum printing.

Further, in the present embodiment, since a vacuum printing process can perform a multi-stage filling, with multiple layers and multiple vacuums breaking the vacuum, through multiple layers and pressure difference, the atmospheric pressure sinks when vacuum is broken, so that the filler is densely packed such that the second conductive circuit 350 does not have holes. Therefore, in this embodiment, vacuum printing includes filling the conductive material multiple times in each of the grooves, multiple times of vacuuming and vacuum breaking processes.

Further, in the present embodiment, a step of performing heat treatment the conductive material 351 to cure is included after each filling or after completing every filling by a high-precision laser drill process or a trench process combined with the vacuum printing process. The conductive material 351 filled into the groove 340 generates a cohesive force by the heat treatment, and the corner of the second conductive circuit 350 (such as the corner at the section of FIG. 5E and the corner of the second conductive circuit 350 in the projection direction) is rounded and continuous. Therefore, unevenness, offset of the conductive pattern, and the disconnection problem at the corners can be improved.

Further, in the present embodiment, the vacuum printing process may use a solvent-free or non-volatile solvent filler having a higher viscosity (110000 cpa·s) and a higher thixotropic index than the filler (including solvent or volatile solvent) used in a dispensing process, so that a formability of the process is better when forming a wiring. In a specific implementation, the conductive material 351 filled in the vacuum printing process has a thixotropic index of >4.5; and a viscosity of >105000 cpa·s (viscosity unit).

A semiconductor unit is further provided in the first embodiment of the present disclosure. As shown in FIG. 5E, the semiconductor unit includes a substrate 310, a first electronic component 320, a first plastic seal layer 330, and a second conductive circuit 350.

The substrate 310 includes a first conductive circuit 311. The first conductive circuit 311 may be formed on a side surface of the substrate 310. In other embodiments, the first conductive circuit 311 may be formed in the substrate 310 and may form a conductive pattern on a side of the substrate 310. The first electronic component 320 is disposed on a side of the substrate 310. The first plastic seal layer 330 covers the substrate 310 and the first electronic component 320. The first plastic seal layer 330 includes a plurality of grooves 340. The groove 340 exposes at least a portion of the first conductive circuit 311 of the substrate 310. The conductive material is filled in the groove 340 by vacuum printing to form the second conductive circuit 350, and the second conductive circuit 350 is electrically connected to the first conductive circuit 311 of the substrate 310.

Figure 4:
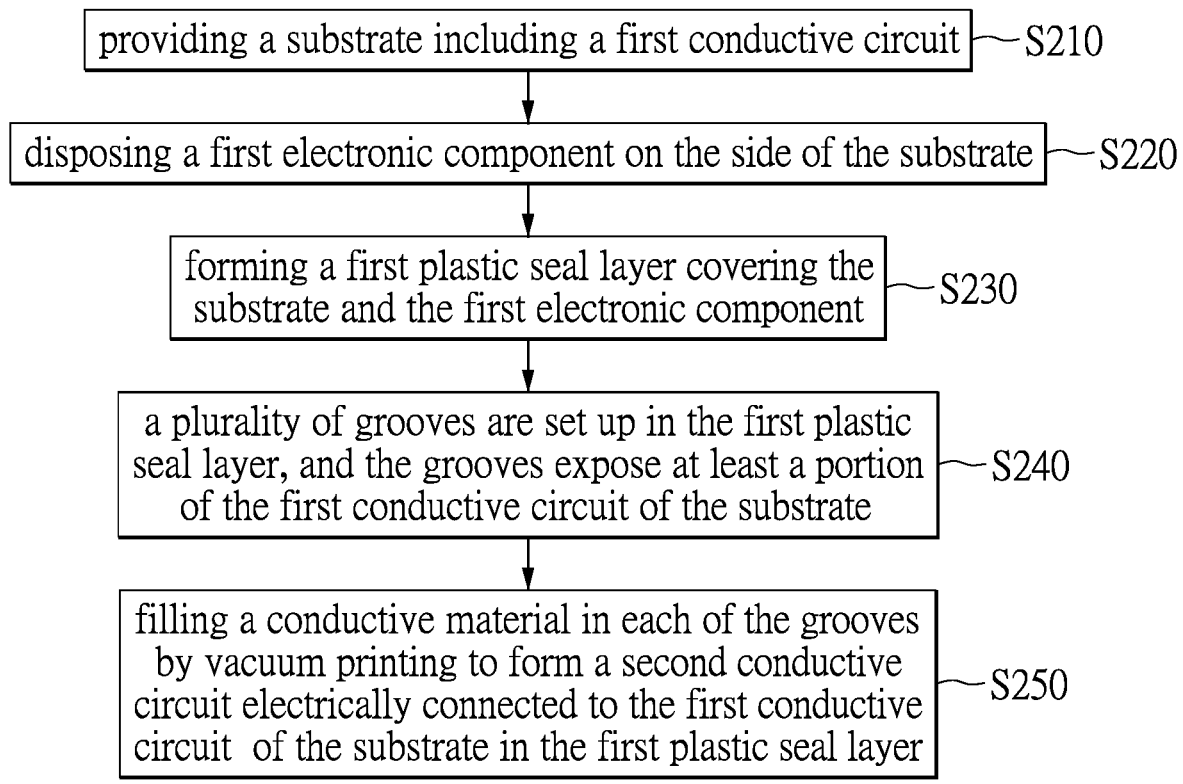
FIG. 4 is a flow chart of a semiconductor assembly manufacturing method according to a first embodiment of the present disclosure.
Figure 6:
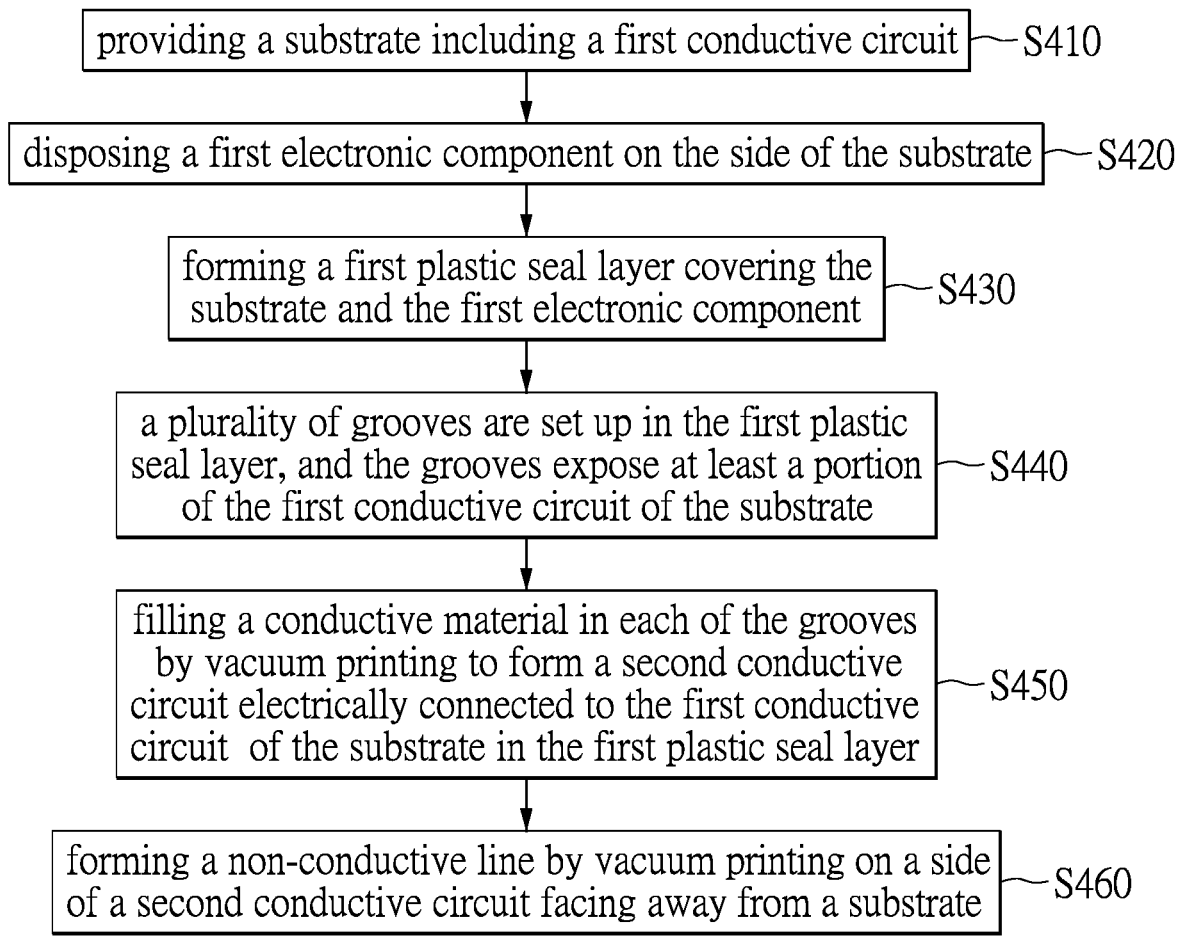
FIG. 6 is a flow chart of a semiconductor assembly manufacturing method according to a second embodiment of the present disclosure.

In a second embodiment of the present disclosure, a semiconductor assembly manufacturing method is provided, and will be described below with reference to the flowchart of FIG. 6 and the manufacturing processes of FIGS. 7A to 7B. The semiconductor assembly manufacturing method includes the following steps:

Steps S410 to S450 are as same as steps S210 to S250 shown in FIG. 4 (referring to FIG. 5A to FIG. 5E), and details are not described herein.

Step S460: forming a non-conductive line 360 by vacuum printing on a side of a second conductive circuit 350 facing away from a substrate 310, wherein the non-conductive line 360 is connected to the second conductive circuit 350.

Figure 7A:
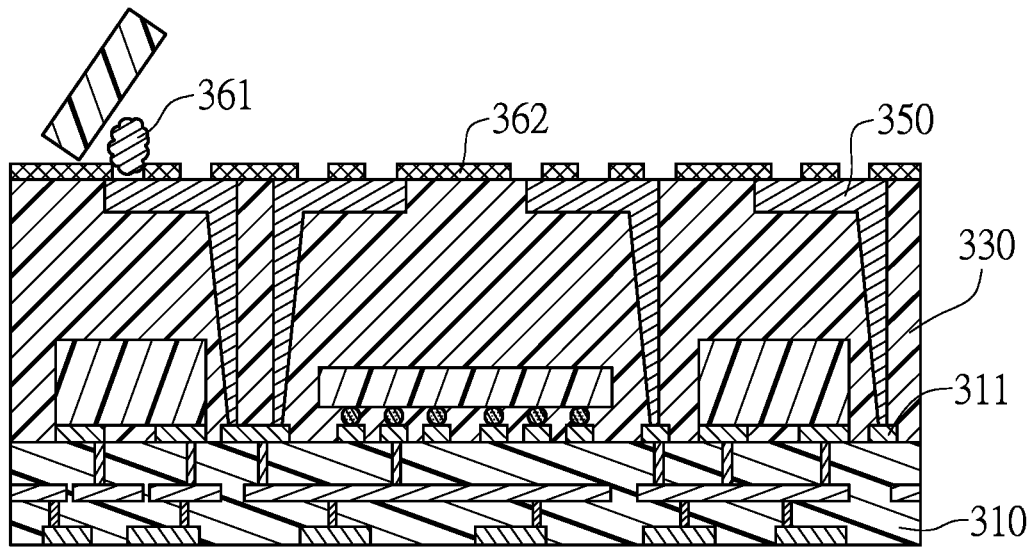
FIGS. 7A to 7B are schematic views of a manufacturing process of the semiconductor assembly according to the second embodiment of the present disclosure.
Figure 7B:
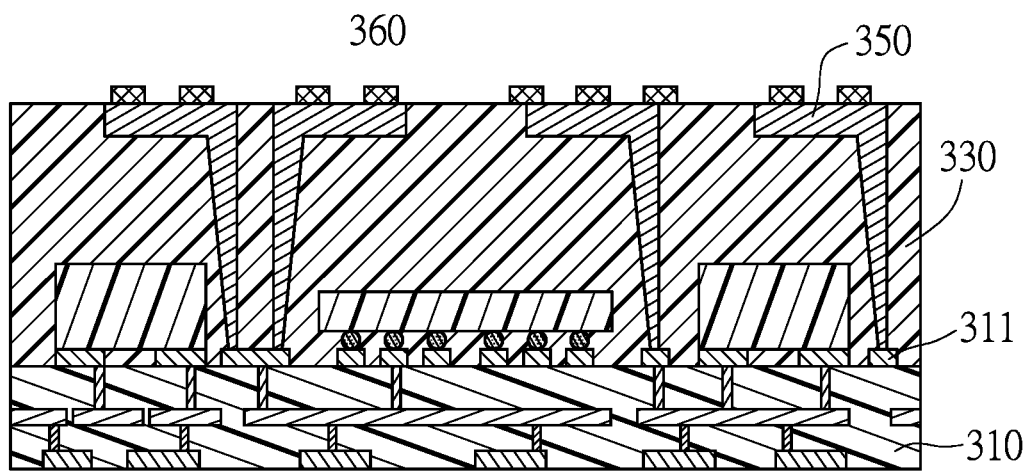

In the present embodiment, as shown in FIGS. 7A to 7B, a circuit defining pattern 362 is formed/disposed on the side of the second conductive circuit 350 facing opposite to the substrate 310 to define a circuit pattern of the non-conductive line 360. At the same time, a non-conductive material 361 is prevented from remaining on the surface of a first plastic seal layer 330 and the second conductive circuit 350 facing away from the substrate 310 without providing a non-conductive circuit pattern. The non-conductive material 361 is filled between respective pattern defining layers 362 by a vacuum printing process to form a non-conductive line 360.

Specifically, as a thickness of the non-conductive line 360 is much smaller than a thickness of the second conductive circuit 350 in the cross-sectional view, the non-conductive line 360 can be formed without using a plurality of layers when filling and multiple times of vacuuming. However, the present disclosure is not limited thereto.

In the second embodiment of the present disclosure, a semiconductor assembly is further provided. As shown in FIG. 7B, the semiconductor assembly includes the substrate 310, a first electronic component 320, the first plastic seal layer 330, the second conductive circuit 350, and the non-conductive line 360.

The substrate 310 includes a first conductive circuit 311. The first conductive circuit 311 may be formed on a side surface of the substrate 310. In other embodiments, the first conductive circuit 311 may be formed in the substrate 310 and may form a conductive pattern on a side of the substrate 310. The first electronic component 320 is disposed on a side of the substrate 310. The first plastic seal layer 330 is disposed on a side of the first electronic component 320 facing away the substrate 310, and the first plastic seal layer 330 covers the substrate 310 and the first electronic component 320. The first plastic seal layer 330 includes a plurality of grooves 340. The groove 340 exposes at least a portion of the first conductive circuit 311 of the substrate 310. The conductive material is filled in the groove 340 by vacuum printing to form the second conductive circuit 350, and the second conductive circuit 350 is electrically connected to the first conductive circuit 311 of the substrate 310. The non-conductive line 360 is disposed on a side of the second conductive circuit 350 facing away from the substrate 310 by vacuum printing, and the non-conductive line 360 is connected to the second conductive circuit 350.

Therefore, an adapter plate can be formed by the second embodiment of the present disclosure. Compared with a formation method of the adapter plate in the related art, the steps of forming solder balls, a cutting process, and a stacking process are reduced, and pollution caused by the wet process is also reduced. On the other hand, implementing the miniaturization of the adapter plate structure does not require multi-layer substrates stacking, thereby preventing the heat treatment from warping and affecting the alignment of the components. On the other hand, the second conductive circuit formed by filling the conductive material by vacuum printing technology has high compactness, stabilizes wiring, and maintains the electrical performance optimally.

Figure 8:
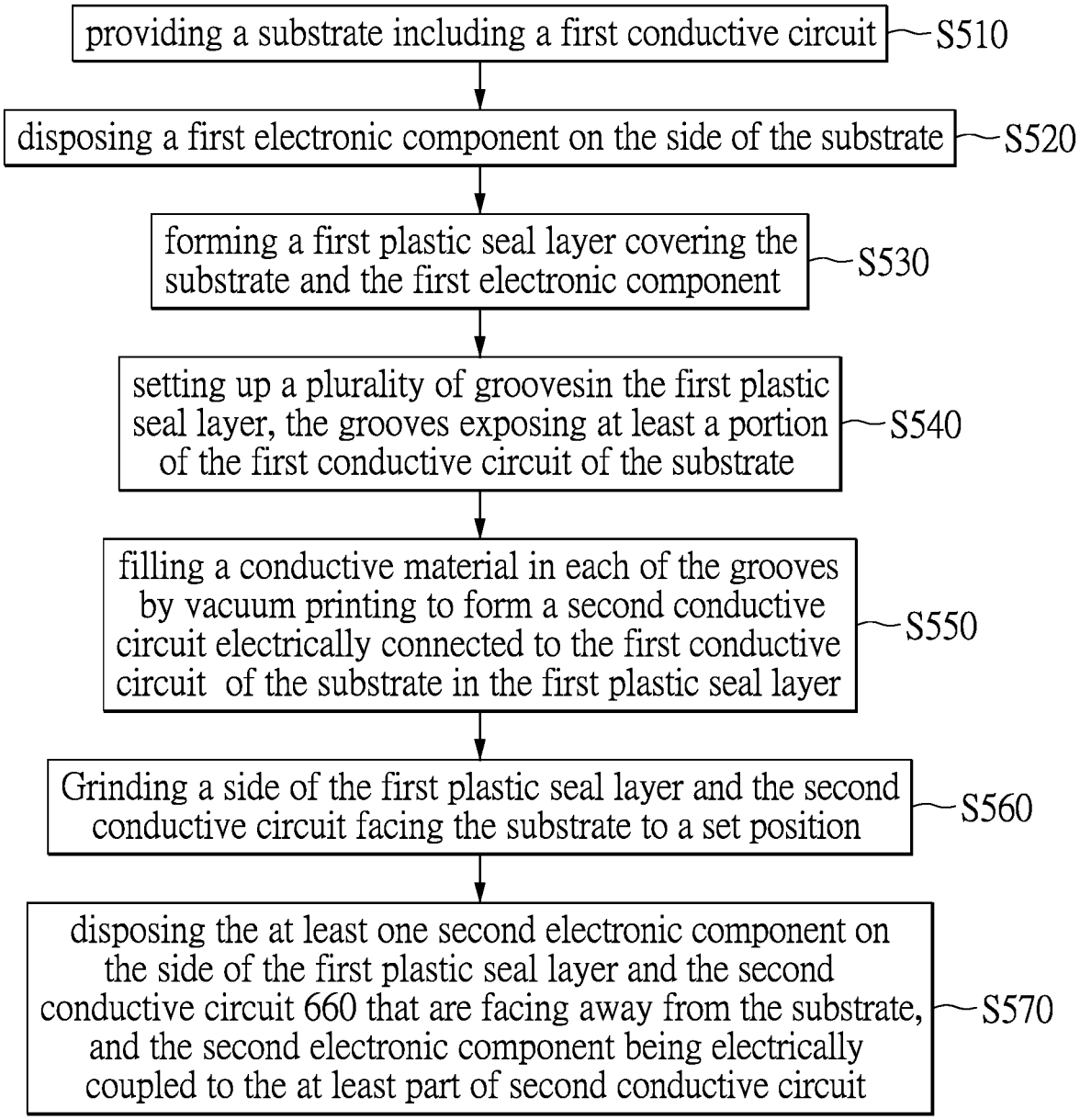
FIG. 8 is a flow chart of a semiconductor assembly manufacturing method according to a third embodiment of the present disclosure.

In a third embodiment of the present disclosure, a method of manufacturing a semiconductor unit is provided, and will be described below with reference to the flowchart of FIG. 8 and the manufacturing processes of FIGS. 9A to 9H. The method of manufacturing a semiconductor unit includes the following steps:

Step S510: providing a substrate 610 including a first conductive circuit 611.

Figure 9A:
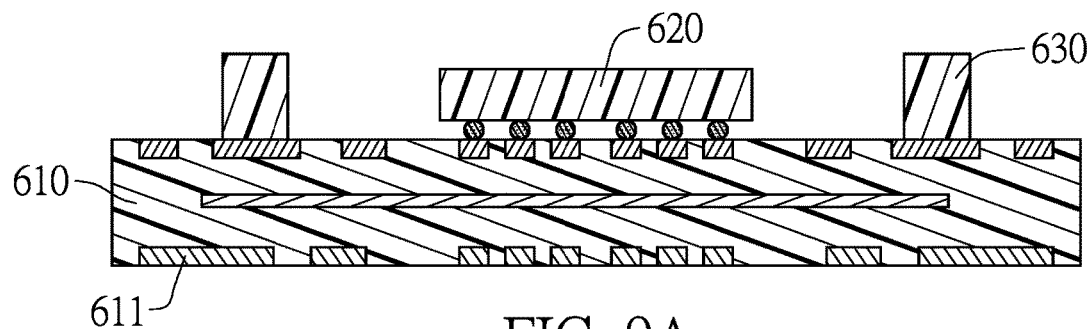
FIGS. 9A to 9H are schematic views of a manufacturing process of the semiconductor assembly according to the third embodiment of the present disclosure.

As shown in FIG. 9A, the first conductive circuit 611 may be formed in the substrate 610 and may form a conductive pattern on a side of the substrate 610. In other embodiments, the first conductive circuit 611 may be formed on a side surface of the substrate 610.

Step S520: disposing a first electronic component 620 on the side of the substrate 610.

Specifically, the first electronic component 620 may be disposed on a side of the substrate 610 by reflow soldering, and the first electronic component 620 may be electrically connected to the first conductive circuit 611 of the substrate 610 through solder balls. The assembly of the first electronic component 620 and the substrate 610 is not limited thereto, and those skilled in the art can implement more variations.

Figure 9B:
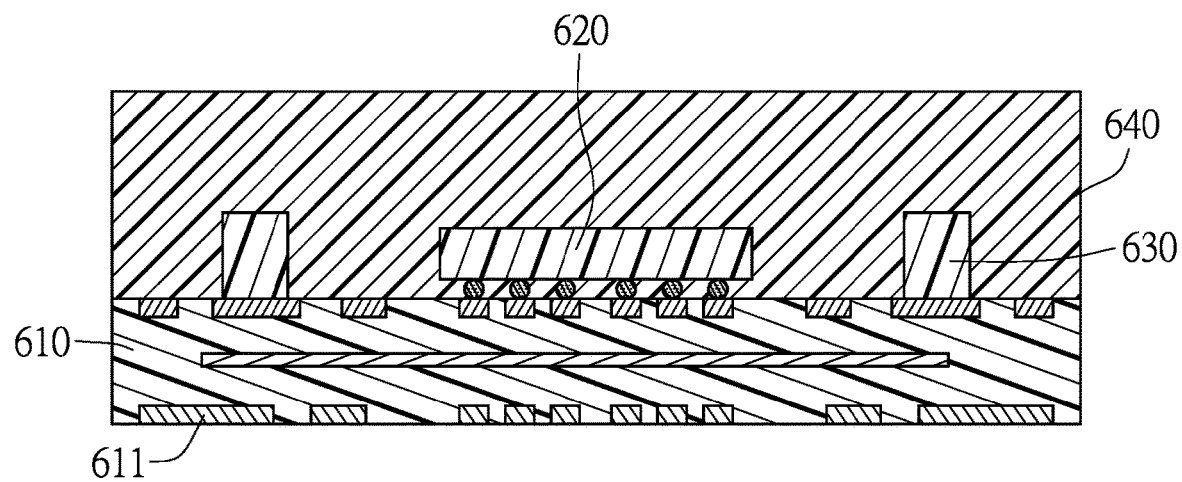

Step S530: forming the first plastic seal layer 640 covering the substrate 610 and the first electronic component 620 as shown in FIG. 9B.

Step S540: setting up a plurality of grooves 650 in the first plastic seal layer 640, the grooves 650 exposing at least a portion of the first conductive circuit 611 of the substrate 610.

Figure 9C:
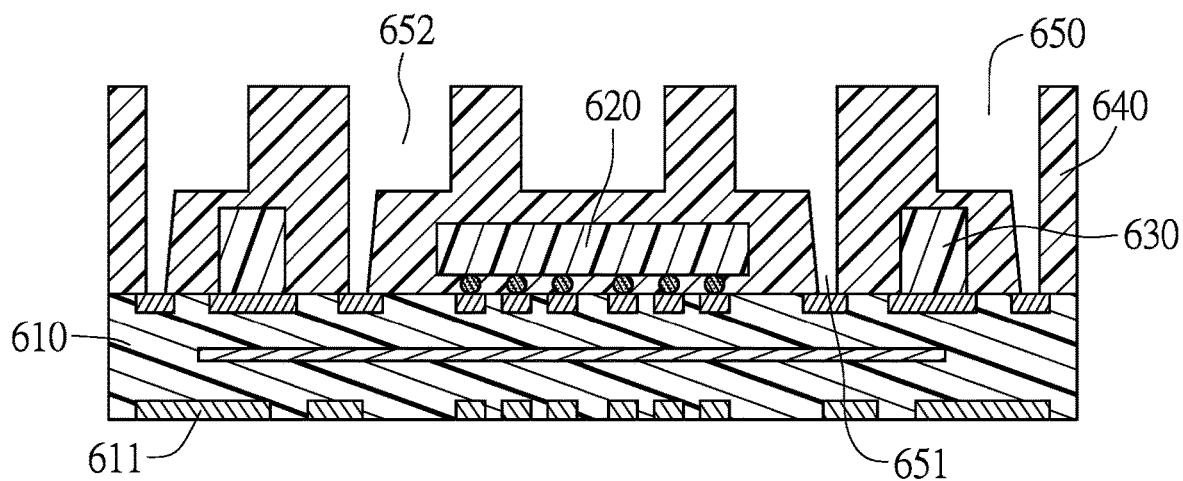

Specifically, a laser drill process or a trench process may be adopted to form the groove 650 in the first plastic seal layer 640, as shown in FIG. 9C. Step S550: filling a conductive material in each of the grooves 650 by vacuum printing to form the second conductive circuit 660 electrically connected to the first conductive circuit 611 of the substrate 610 in the first plastic seal layer 640.

Figure 9D:
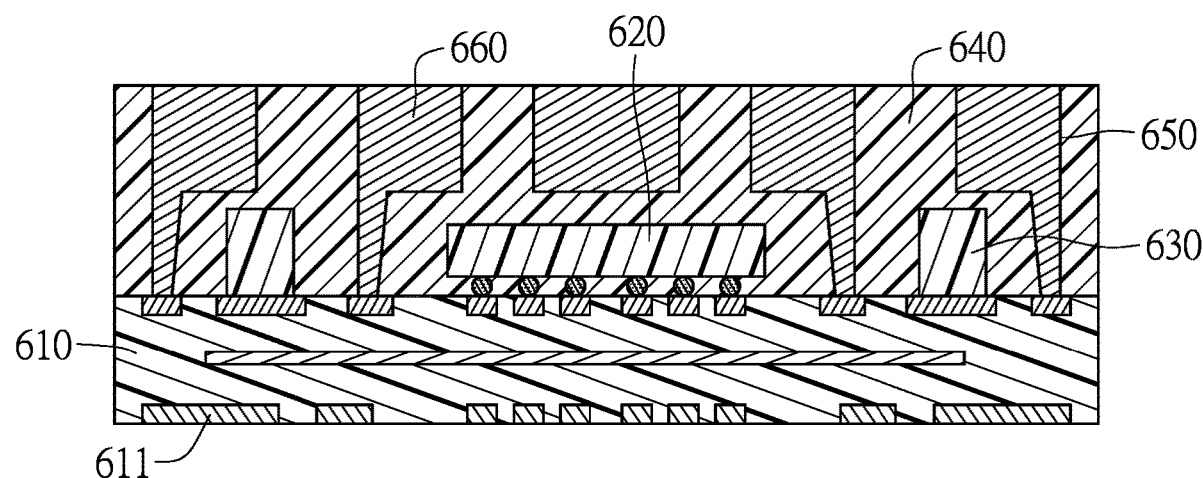

In this embodiment, as shown in FIG. 9D, the vacuum printing technology used to form the second conductive circuit 660 can be the same as that of the first embodiment and the second embodiment, and details are not described herein.

Step S560: Grinding a side of the first plastic seal layer 640 and the second conductive circuit 660 facing the substrate 310 to a set position.

Figure 9E:
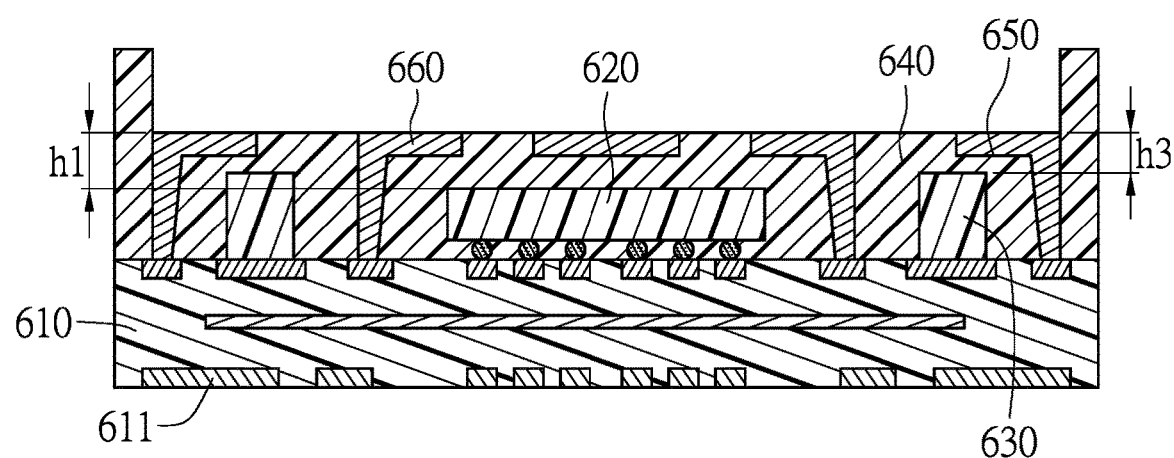

Specifically, as shown in FIG. 9E, the set position can be determined according to the thickness of the electronic component disposed on the substrate 610.

Figure 9F:
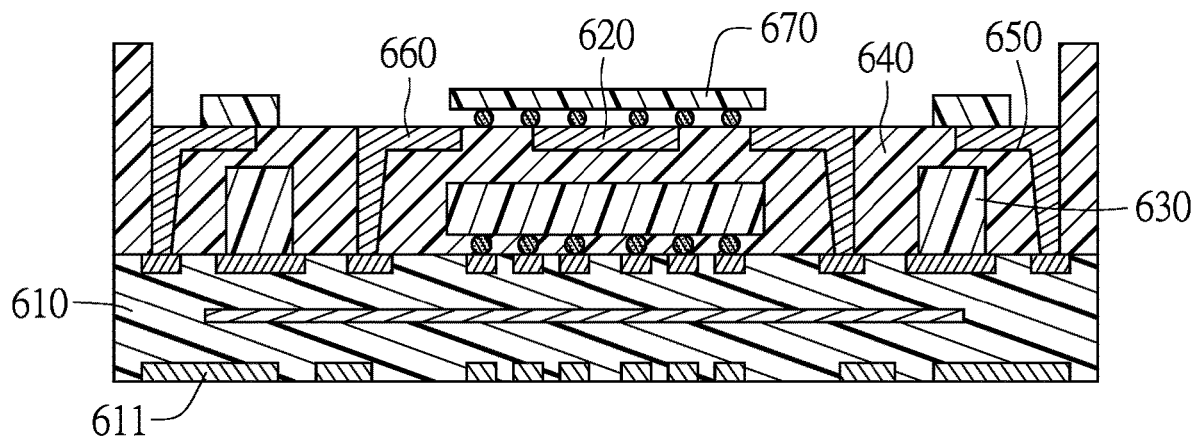

Step S570: disposing the at least one second electronic component 670 on the side of the first plastic seal layer 640 and the second conductive circuit 660 that are facing away from the substrate 610, and the second electronic component 670 being electrically coupled to the at least part of second conductive circuit 660, as shown in FIG. 9F.

In the third embodiment, after the step S520, the step S530 may further include the following steps: disposing at least one third electronic component 630 on the substrate 610. The third electronic component 630 is on the same side as the first electronic component 620, as shown in FIG. 9A. The first plastic seal layer 640 covers the at least one third electronic component 630, as shown in FIG. 9B.

Specifically, the third electronic component 630 is electrically connected to the first conductive circuit 611 of the substrate 610. Further, in the foregoing step S560 the distance between the set position of the grinding and the first electronic component 620 may be greater than a predetermined distance in a direction away from the substrate 610, and/or the distance between the set position of the grinding and the third electronic component 630 may be greater than a predetermined distance in a direction away from the substrate 610.

The thickness of the third electronic component 630 may be less than the thickness of the first electronic component 620, or greater than the thickness of the first electronic component 620, less than the sum of the thicknesses of the first electronic component 620 and the second electronic component 670, or greater than the sum of the thicknesses of the first electronic component 620 and the second electronic component 670, and the present disclosure is not limited thereto. Different thickness of the third electronic component 630 can form different layouts. In addition, the distance h3 between the set position and the third electronic component 630 is greater than a predetermined distance. Therefore, the distance hl between the set position and the first electronic component 620 is greater than the predetermined distance, so that the two predetermined positions form a stepped shape (or only the electronic component with a smaller thickness is set to a set position, and the electronic component with a large thickness is not required to be ground), to form a reasonable layout and implement miniaturization of the semiconductor assembly.

In the third embodiment, referring to FIG. 9C, at least a portion of the groove 650 includes a first groove 651 between the first electronic component 620 and the third electronic component 630, and a second groove 652 in communication with the first groove 651 on a side of the first electronic component 620 and the third electronic component 630 facing away from the substrate 610. The first groove 651 and the second groove 652 fill the conductive material by vacuum printing. In this embodiment, an inner diameter of the second groove 652 is larger than an inner diameter of the first groove 651. Specifically, the second groove 652 is used to define a circuit pattern of the second conductive circuit 660 on the side of the first plastic seal layer 640 facing away from the substrate 610, and the first groove 651 is used to electrically connected with the first conductive circuit 611 of the substrate 610. Therefore, the inner diameter of the first groove 651 is smaller than the inner diameter of the second groove 652, so that a space for accommodating the first electronic component 620 and the third electronic component 630 can be provided at a step where the inner diameter of the first groove 651 is smaller than that formed of the second groove 652, implementing a rational layout. Further, in the grinding step of the above step S560, the set position is not lower than the bottom of the second groove 652 facing the side of the substrate 610, so as to prevent from affecting the circuit pattern of the second conductive circuit 660 on the side of the first plastic seal layer 640 facing away from the substrate 610. Further, through vacuum printing technology in the foregoing step S550, the first groove 651 and the second groove 652 are connected at a rounded structure. Therefore, unevenness, offset of the conductive pattern, and the disconnection problem at the corners are improved. The above groove structure can also be applied to the first embodiment and the second embodiment described above, and the present disclosure is not limited thereto.

Figure 9G:
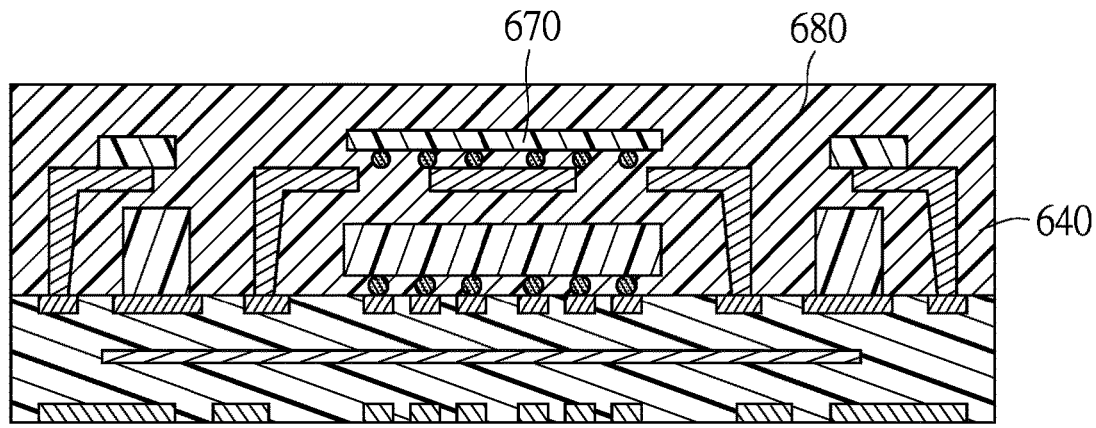
Figure 9H:
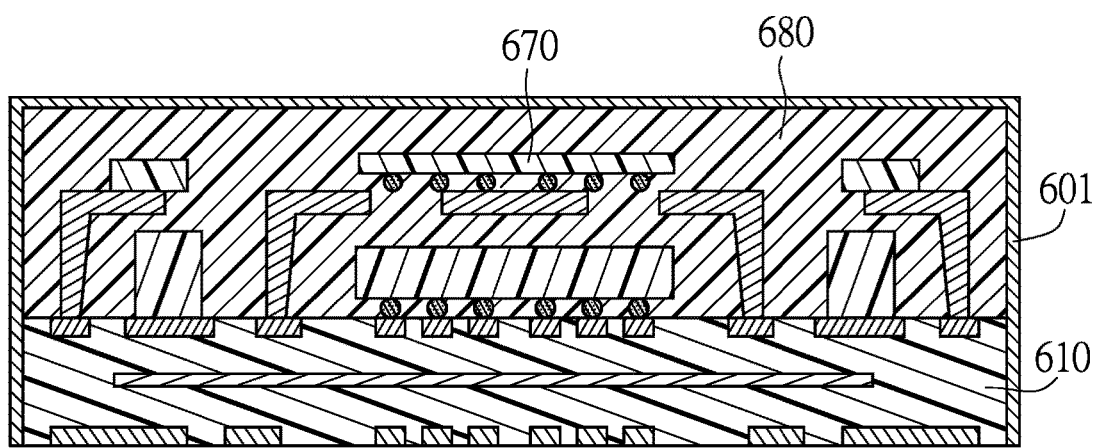

In the third embodiment, after the step S570, the method further includes the following steps: forming a second plastic seal layer 680 on a side of the second electronic component 670 facing away from the substrate 610. As shown in FIG. 9G the second plastic seal layer 680 and the first plastic seal layer 640 surround and cover the second electronic component 670. Referring to FIG. 9H, after forming the second plastic seal layer 680, the method further includes a step of: forming a shielding layer 601 on the outer surface of the first plastic seal layer 640 and the second plastic sealing layer 680, implementing miniaturization and improving shielding effect.

Figure 10:
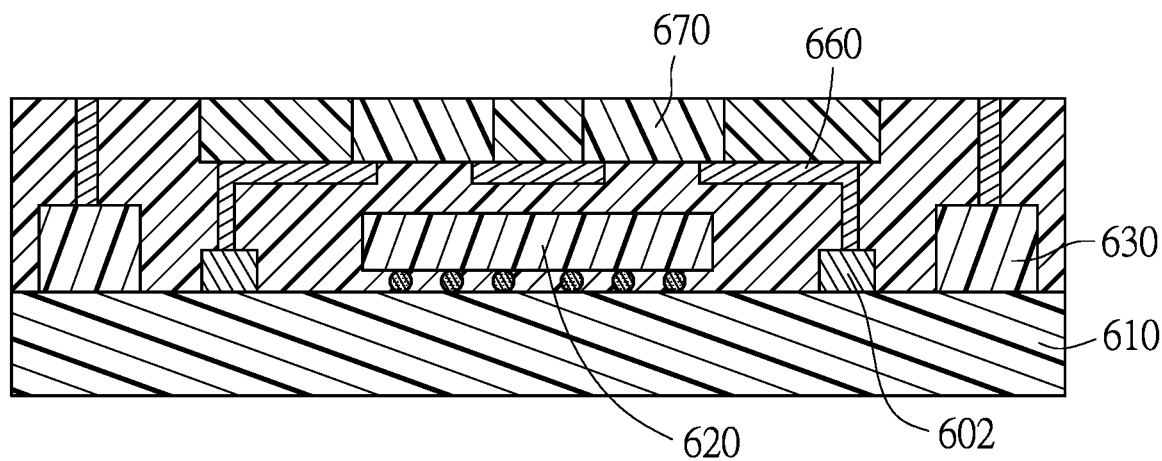
FIG. 10 is a schematic view of a semiconductor assembly in a variation of the third embodiment of the present disclosure.

In a variation of the third embodiment, as shown in FIG. 10, step S520 further includes disposing a stopping component 602 on one side of the substrate 610, and the stopping component 602 is disposed at a position where the groove 650 is set up. The stopping component 602 is used to prevent penetration of the substrate 610 during the setting up of the groove 650.

Further, in a specific implementation of the third embodiment of the present disclosure, the first electronic component may be a power management IC (PMIC), and the second electronic component may be a capacitor, so that the power signal can be used to filter noise power by the second electronic component. That is, a line connecting the first electronic component and the second electronic component is a transmission path of the power signal. However, the transmission path of the power signal requires higher line densification to reduce unnecessary power loss of the power signal in the transmission path. In the transmission path of the power signal, all the power signals connecting the first electronic component and the second electronic component pass through the circuit connecting the first electronic component and the second electronic component, and then are filtered by the second electronic component.

In another specific implementation of the third embodiment of the present disclosure, the second electronic component can be a chip with many I/O. If a compactness of the second conductive circuit is increased, the circuit density can be increased in a limited space to match the I/O of the second electronic component.

In yet another specific implementation of the third embodiment of the present disclosure, the third electronic component may be a capacitor. A connection circuit with the third electronic component (such as the second conductive circuit electrically connected to the third electronic component 630 and exposed on the plastic layer in FIG. 10) can be used as a connection point of external power, so that the third electronic component also has the effect of filtering noise power.

Therefore, a package structure of a semiconductor unit can be formed by the third embodiment of the present disclosure. Compared with a formation method of the adapter plate in the related art, the steps of forming solder balls, a cutting process, and a stacking process are also reduced, and pollution caused by the wet process is also reduced. On the other hand, implementing the miniaturization of the adapter plate structure does not require multi-layer substrates stacking, thereby preventing the heat treatment from warping and affecting the alignment of the components. On the other hand, the second conductive circuit formed by filling the conductive material by vacuum printing technology has high compactness, stabilizes wiring, and maintains the electrical performance optimally.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method of manufacturing a semiconductor unit, comprising:
    providing a substrate including a first conductive circuit;
    disposing a first electronic component on a side of the substrate;
    forming a first plastic seal layer covering the substrate and the first electronic component;
    setting up a plurality of grooves in the first plastic seal layer, wherein the groove exposes at least a portion of the first conductive circuit of the substrate; and
    filling a conductive material in each of the grooves by vacuum printing so as to form a second conductive circuit electrically connected to the first conductive circuit of the substrate in the first plastic seal layer;
    wherein after the conductive material is filled in each of the grooves by vacuum printing to form the second conductive circuit electrically connected to the first conductive circuit of the substrate in the first plastic seal layer, the method further comprises;
    grinding the first plastic seal layer and the second conductive circuit away from the side of the substrate to a set position; and
    disposing at least one second electronic component on the side of the first plastic seal layer and the second conductive circuit facing away from the substrate, wherein the second electronic component is electrically connected to at least part of the second conductive circuit;
    wherein after the first electronic component is disposed on a side of the substrate and before the first plastic seal layer is formed, the method further comprises: disposing at least one third electronic component on the same side of the first electronic component on the substrate;
    wherein a distance from a bottom surface of the second electronic component to the substrate is larger than a distance from a top surface of the third electronic component to the substrate.

2. The method of manufacturing the semiconductor unit according to claim 1, wherein at least a portion of the groove includes a first groove between the first electronic component and the third electronic component, and a second groove located between the first electronic component and a side of the third electronic component facing away from the substrate and in communication with the first groove, and the first groove and the second groove fill the conductive material by vacuum printing.

3. The method of manufacturing the semiconductor unit according to claim 2, wherein a rounded structure is formed where the first groove and the second groove are connected.

\* \* \* \* \*